United States Patent
Rathmell et al.

(10) Patent No.: US 7,361,915 B2
(45) Date of Patent: Apr. 22, 2008

(54) BEAM CURRENT STABILIZATION UTILIZING GAS FEED CONTROL LOOP

(75) Inventors: Robert D. Rathmell, Murphy, TX (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 204 days.

(21) Appl. No.: 11/290,346

(22) Filed: Nov. 30, 2005

(65) Prior Publication Data
US 2007/0120075 A1    May 31, 2007

(51) Int. Cl.
*G21K 5/10* (2006.01)
*H01J 37/08* (2006.01)

(52) U.S. Cl. .............. 250/492.21; 250/423; 250/427; 250/492.2; 250/493.1; 250/281; 250/443.1; 250/442.11; 315/111.81

(58) Field of Classification Search ........... 250/492.21, 250/423, 427, 492.2, 493.1, 281, 443.1, 442.11; 315/111.81
See application file for complete search history.

(56) References Cited

U.S. PATENT DOCUMENTS

| | | | |
|---|---|---|---|
| 3,496,029 A | 2/1970 | King et al. | |
| 3,909,305 A | 9/1975 | Boroffka et al. | |
| 4,659,899 A | 4/1987 | Welkie et al. | |
| 5,306,921 A * | 4/1994 | Tanaka et al. | 250/492.21 |
| 5,943,594 A * | 8/1999 | Bailey et al. | 438/514 |
| 6,777,686 B2 | 8/2004 | Olson et al. | |

FOREIGN PATENT DOCUMENTS

| EP | 1 220 271 A2 | 7/2002 |
|---|---|---|
| JP | 2 172 152 A | 7/1990 |

OTHER PUBLICATIONS

"SIMOX Wafer Fabrication by 100mA O⁺Implantation Using the UI-6000 Implanter", K.Tokiguchi, H. Seki, T. Seki, J. Itou, Y. Higuchi, K. Mera, S. Tanaka, Y. Yamashita, I Hashimoto and A. Yoshikawa, IEEE, 2002, pp. 629-632.
"Characterization of a High Throughput Implanter for the Low Temperature Polysilicon AMLCD Industry", Y.Shao, J. Blake, K. Chen, A. Brailove, M. King and M. Sato, IEEE, 1999, pp. 251-254.
International Search Report, Int'l Application No. PCT/US/2006/044817, Int'l Filing date Nov. 17, 2006, 3pgs.

* cited by examiner

*Primary Examiner*—Jack I. Berman
*Assistant Examiner*—Meenakshi S Sahu
(74) *Attorney, Agent, or Firm*—Eschweiler & Associates, LLC

(57) ABSTRACT

One or more aspects of the present invention pertain to stabilizing the current or density of an ion beam within an ion implantation system by selectively adjusting a lone parameter of feed gas flow. Adjusting the gas flow does not necessitate adjustments to other operating parameters and thereby simplifies the stabilization process. This allows the beam current to be stabilized relatively quickly so that ion implantation can begin promptly and continue uninterrupted. This improves throughput while reducing associated implantation costs.

20 Claims, 5 Drawing Sheets

BEAM CURRENT STABILIZATION UTILIZING GAS FEED CONTROL LOOP

FIELD OF THE INVENTION

The present invention relates generally to ion implantation systems, and more particularly to stabilizing beam current via a gas feed control loop.

BACKGROUND OF THE INVENTION

Ion implantation systems are the mechanisms utilized to dope semiconductor substrates with dopants or impurities in integrated circuit manufacturing. In such systems, a dopant material is ionized and an ion beam is generated there-from. The beam is directed at the surface of a semiconductor wafer or workpiece in order to implant the wafer with one or more dopant elements. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for directing and/or filtering (e.g., mass resolving) the ions within the beam using magnetic fields, and a target chamber containing one or more semiconductor wafers or workpieces to be implanted by the ion beam.

Ion implanters are advantageous because they allow for precision with regard to both quantity and placement of dopants within the silicon. In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. Ion energy, on the other hand, is used to control the degree or depth to which ions are implanted into the workpiece, which can be useful in establishing different junction depths in semiconductor devices, for example.

One commercially available ion implantation system uses an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions that strike the wafers to penetrate those wafers in the implantation chamber. Such selective implantation thus allows an integrated circuit to be fabricated.

It can be appreciated that the density of the ion beam or the number of ion per unit area in the beam is important to control. For example, it may be desirable to uniformly implant a workpiece with ions so that multiple devices formed upon/out of the workpiece operate in a consistent and predictable manner. In other instances it may be desirable to implant more dopant ions within some workpieces or areas of workpieces than others. In any event, it can also be appreciated that it is generally desirable to expedite fabrication processes to reduce costs, conserve resources and increase throughput and/or yield.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

One or more aspects of the present invention pertain to stabilizing the current or density of an ion beam within an ion implantation system by selectively adjusting a lone parameter of feed gas flow. Adjusting the gas flow does not necessitate adjustments to other operating parameters and thereby simplifies the stabilization process. This allows the beam current to be stabilized relatively quickly so that ion implantation can begin promptly and continue uninterrupted. This improves throughput while reducing associated implantation costs.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
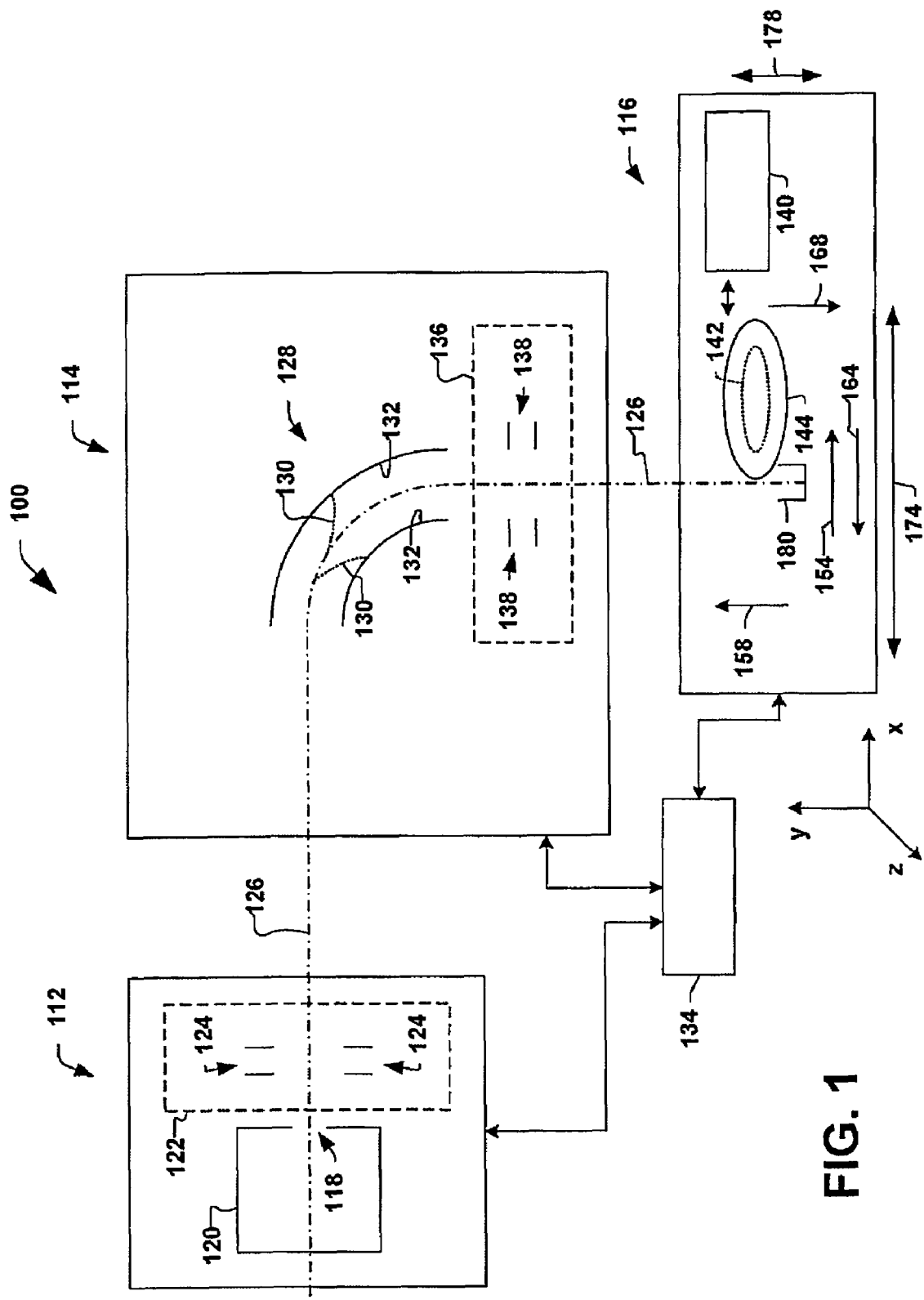
FIG. 1 is a schematic block diagram illustrating an ion implantation system wherein one or more aspects of the present invention may be implemented.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

As alluded to above, in semiconductor fabrication processing, semiconductor wafers or workpieces are implanted with charged particles or ions. The ions exhibit desired electrical characteristics due to their net positive or negative electrical charges. When utilized in association with semiconductor processing, such ionized materials are referred to as dopants because they "dope" or alter the electrical characteristics of the base or other layers that they are implanted into, causing the layers to have desired and predictable electrical behavior.

FIG. 1 illustrates in schematic block diagram form an ion implantation system 100 wherein one or more aspects of the present invention may be implemented. The implantation system 100 includes an ion source 112, a beamline assembly 114, and a target or end station 116. The ion source 112 comprises an ion generation chamber 120 and an ion extraction (and/or suppression) assembly 122. A (plasma) gas of a dopant material (not shown) to be ionized is located within the generation chamber 120. The dopant gas can, for example, be fed into the chamber 120 from a gas source (not shown). Energy can be imparted to the dopant gas via a power source (not shown) to facilitate generating ions within the chamber 120. It will be appreciated that the ion source 112 can also utilize any number of suitable mechanisms (none of which are shown) to excite free electrons within the ion generation chamber 120, such as RF or microwave excitation sources, electron beam injection sources, electromagnetic sources and/or a cathode which creates an arc discharge within the chamber, for example. The excited electrons collide with the dopant gas molecules in the chamber 120 and ions are thereby generated. Generally positive ions are generated, although the present invention is applicable to systems wherein negative ions are generated by the source 112. The ions are controllably extracted through a slit 118 in the chamber 120 by the ion extraction assembly 122, which comprises a plurality of extraction and/or suppression electrodes 124. It will be appreciated that the extraction assembly 122 can include, for example, an extraction power supply (now shown) to bias the extraction and/or suppression electrodes 124 to accelerate the ions from the source 112 along a trajectory leading to an ion mass analyzing magnet 128 within the beamline assembly 114.

Accordingly, the ion extraction assembly 122 functions to extract a beam 126 of ions from the plasma chamber 120 and to accelerate the extracted ions into the beamline assembly 114, and more particularly into a mass analysis magnet 128 within the beamline assembly 114. The mass analysis magnet 128 is formed at about a ninety degree angle and a magnetic field is generated therein. As the beam 126 enters the magnet 128, it is correspondingly bent by the magnetic field such that ions of an inappropriate charge-to-mass ratio are rejected. More particularly, ions having too great or too small of a charge-to-mass ratio are deflected 130 into side walls 132 of the magnet 128. In this manner, the magnet 128 only allows those ions in the beam 126 which have the desired charge-to-mass ratio to completely traverse therethrough. Control electronics or a controller 134 can be included to adjust the strength and orientation of the magnetic field, among other things. The magnetic field can, for example, be controlled by regulating the amount of electrical current running through field windings of the magnet 128. It will be appreciated that the controller 134 may include a programmable micro-controller, processor and/or other type of computing mechanism for overall control of the system 100 (e.g., by an operator, previously and/or presently acquired data and/or programs).

The beamline assembly 114 may also include an accelerator 136, for example, that comprises a plurality of electrodes 138 arranged and biased to accelerate and/or decelerate ions, as well as to focus, bend and/or decontaminate the ion beam 126. Further, it will be appreciated that ion beam collisions with other particles degrade beam integrity so that the entire beamline assembly 114 from the source 112 to the end station 116, including the mass analysis magnet 128, may be evacuated by one or more pumps (not shown). Downstream of the accelerator 136 is the end station 116 which receives the mass analyzed ion beam 126 from the beamline assembly 114. The end station 116 includes a scanning system 140 that may comprise a support or end effector 142 upon which a workpiece 144 to be treated is mounted for selective movement thereby. The end effector 142 and workpiece 144 reside in a target plane that is generally perpendicular to the direction of the ion beam 126.

The workpiece 144 is moved (e.g., via the end effector 142) back and forth in directions 154, 164 along a first or "fast" scan path 174 (e.g., along the x-axis). The workpiece 144 is also moved through slow scan directions 158 or 168 along a second or "slow" scan path 178 (e.g., along the y-axis) as the workpiece 144 oscillates along the first scan path 174. By way of example, in the system 100 illustrated in FIG. 1, the workpiece 144 has just completed a fast scan in direction 154, and is thus ready to be moved back through fast scan direction 164 (e.g., once the workpiece 144 has been indexed along the slow scan path 158 (or 168)).

A measurement component 180 (e.g., a Faraday cup) may also be incorporated into the end station 116. The measurement component 180 is situated behind the workpiece 144 (e.g., so as to not interfere with the ion implantation process) and measures the beam current when the workpiece 144 passes through the beam 126 and/or where the beam passes through an aperture within the workpiece 144. The measurement component 180 then outputs a signal indicative of the measured beam current to controller 134.

A source of plasma (not shown) may also be included in the end station 116 to bathe the beam 126 in neutralizing plasma to mitigate the number of positive charges that would otherwise accumulate on a target workpiece 144. A plasma shower would, for example, neutralize charges that would otherwise accumulate on a target workpiece 144 as a result of being implanted by the (positively) charged ion beam 126.

According to one or more aspects of the present invention, the beam current is stabilized by adjusting the gas fed into the ion generation chamber 120. For example, readings taken by the measurement component 180 can be used by the controller 134 to selectively vary the amount of gas fed into the chamber 120. Adjusting the source gas flow allows the beam current to be stabilized without having to adjust other operating parameters.

Figure 2:
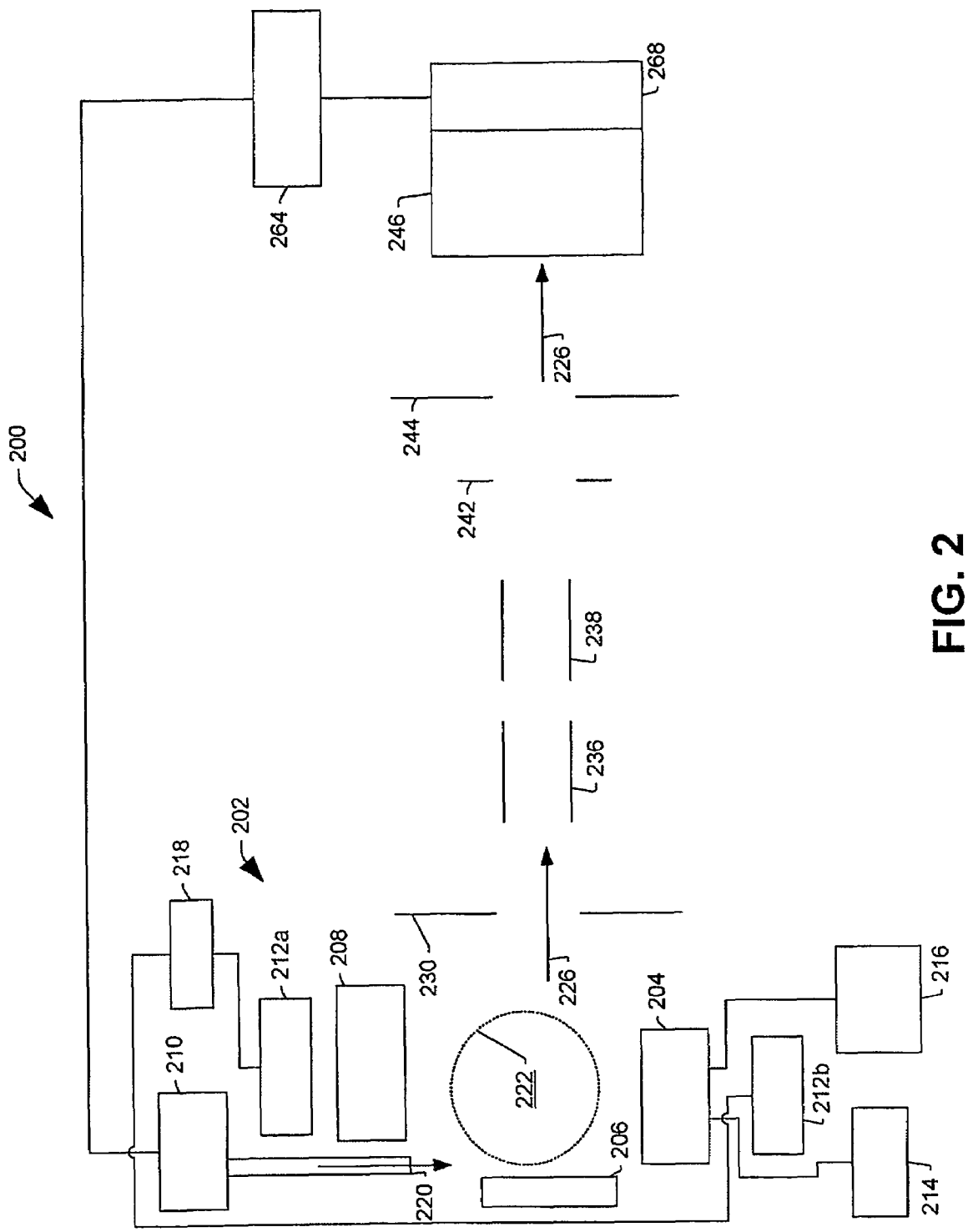
FIG. 2 is another schematic block diagram illustrating an ion implantation system wherein one or more aspects of the present invention may be implemented.

Turning to FIG. 2, another ion implantation system 200 wherein one or more aspects of the present invention may be implemented is illustrates in schematic block diagram form. The system 200 is similar to the system 100 of FIG. 1, but illustrates an ion source in a somewhat greater detail. The system 200 includes an ion source 202 for generating a source of ions. In the example shown, the ion source 202 includes a cathode 204, an anode 206, a mirror electrode 208, a gas supply 210 and source magnet components 212a, 212b. A power supply 214 and an arc power supply 216 are operatively coupled to the cathode 204, and another supply 218 is also connected to the source magnet components 212a, 212b in the example shown.

In operation, the gas supply 210 provides one or more precursor gases (e.g., via a conduit 220) into an area 222 of the source 202 wherein the ions are generated. The cathode 204, in one example, takes the form of a filament (e.g., a rod made of tungsten or tungsten alloy) is heated by the power supply 214 (e.g., to about 2000 degrees Kelvin) to excite electrons therein. The arc supply 216, in turn, provides additional energy to the cathode 204 (e.g., to heat the cathode to about 2800 degrees Kelvin) to cause electrons to jump from the cathode 204 into the area 222 wherein the gas is situated. The anode 206 assists with drawing the electrons into area 222, and may include sidewalls (not shown) of the ion source 202, for example. Further, supply 216 may also be coupled to the anode 206 so that a bias can be set up between the cathode 204 and the anode 206 to facilitate drawing the electrons into area 222.

The mirror electrode 208 assists with maintaining the electrons within area 222. In particular, a bias imparted to the mirror electrode 208 serves to repel electrons emitted from the cathode 204 back into area 222. Similarly, a magnetic field induced within the ion source 202 by the source magnet serves to maintain electrons within area 222 and off of sidewalls (not shown) of the source 202. In the example shown, two components 212a and 212b of the source magnet are shown. These may be indicative, of a cross-sectional view of windings and/or a yoke of an electromagnet, for example. The electrons moving around within area 222 collide with the gaseous molecules within area 222 to create the ions. In particular, electrons that collide with gaseous molecules with sufficient force cause one or more electrons to become dislodged from the molecules, thus producing positively charged gaseous ions. It will be appreciated that the magnetic field applied by the source magnet may be parallel to a line between the cathode and mirror electrode to increase the electron path length and to assist with suspending a plasma of both ions and electrons within area 222.

It will be also appreciated that the present invention contemplates and has application to negatively charged ions also. It will be further appreciated that the present invention contemplates and has application to ion sources of types other than the arc discharge source described above. For example, an ion source may include a means of RF excitation to produce ions. Such a source is disclosed in U.S. Pat. No. 5,661,308, the entirety of which is hereby incorporated by reference. An additional example is an ion source that may include a means of excitation by electron beam injection to produce ions. This is sometimes referred to as a "soft ionization" type of source. An example of such a source is disclosed in U.S. Pat. No. 6,452,338, the entirety of which is also hereby incorporated by reference. An additional example of an ion source to which the present invention has application is an ion source that includes a means of microwave excitation to produce a plurality of ions.

Ions comprising the ion beam 226 are extracted (e.g., at several kilovolts) through a slit (not shown) in the ion source 202 by electrodes 230 which are generally biased negatively with respect to the ion source 202. In addition to extracting ions from the ion source, electrodes 230 also serve the function of providing suppression of electrons which are attracted to the ion source 202 by its generally positive bias. The beam 226 then enters the beamguide 236 and associated analyzer magnet 238. After being separated according to a desired mass-to-charge ratio in the beamguide 236 and analyzer magnet 238, the beam 226 enters a resolving aperture defined by plates 242 that further separates out undesired species of ions. The beam 226 then encounters yet another set of electrodes 244 before being bathed in a plasma to neutralize space charge and charge build-up that would otherwise accumulate on a target workpiece. The beam 226 then impinges upon one or more workpieces (not shown) located within an end station 246.

A measurement component 268 (e.g., a Faraday cup) is included and is situated so that the beam 226 impinges thereon when ion are not being implanted into a workpiece in the end station 246. The measurement component 268 measures beam current and provides a signal indicative thereof to the controller 264. According to one or more aspects of the present invention, the gas supply 210 is adjusted in response to readings taken by the measurement component 268 to stabilize the beam current. It can be appreciated that the gas flow rate can be adjusted manually by an operator of the implantation system in response to the readings taking by the measurement component 268 or automatically by the controller 264, and that such adjustments may be made intermittently or continually in a feedback loop type arrangement.

It will be appreciated that the beam current can fluctuate significantly when the implantation system is initially activated to generate the ion beam, and can continue to fluctuate throughout the implantation process. As such, stabilizing the ion beam as described herein helps to establish more predictable ion implantations. One explanation for fluctuations in beam current relates to source gas disassociation wherein more ions are produced than anticipated. More particularly, phosphine ($Ph_3$) is commonly used as a source gas to generate positive ions therefrom. However, interior wall surfaces of the ion source comprise molybdenum. Phosphine molecules can interact with the molybdenum to disassociate into H and P (hydrogen and phosphorous) and/or H and $PH_2$, for example, which can be readily ionized by the electrons in arc plasma within the chamber. Phosphine is particularly susceptible to disassociation at the high temperatures, such as the 400-1000 degrees Celsius temperatures of parts within the ion source. The extra ions resulting from this disassociation can increase the amount of time it takes for the beam current to stabilize (e.g., up to ten minutes or longer).

Figure 3:
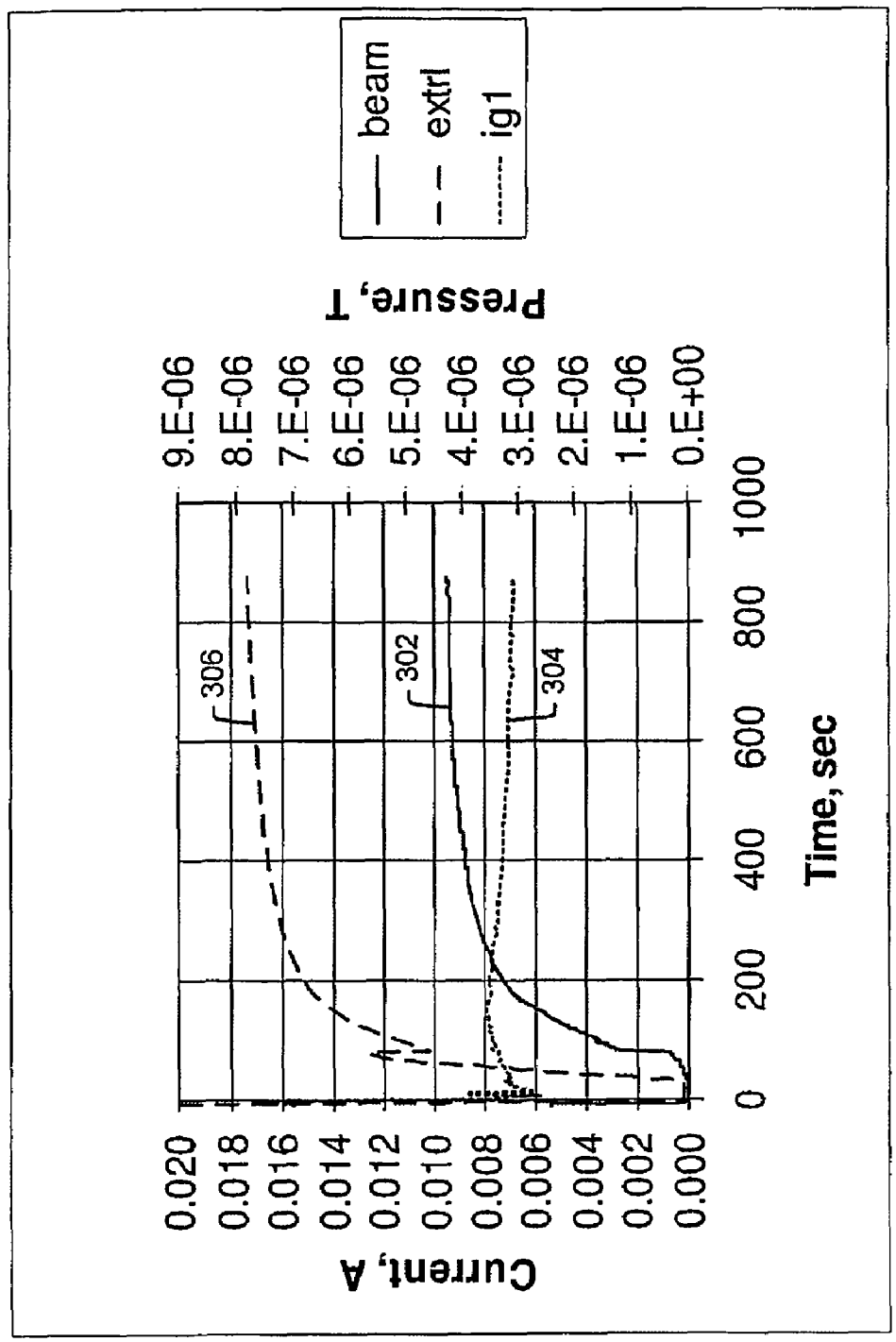
FIG. 3 is a graphical depiction illustrating a natural stabilization of beam current.

Turning to FIG. 3, for example, a graphical depiction 300 illustrates the amount of time it takes an ion beam 302 to settle down where the ion implantation system is initiated with a set of historical parameters previously used to develop a desired beam current (e.g., having a desired density), without adjusting parameters to actively control beam current after the initial conditions are established. It can be seen that the beam 302 starts stabilizing at around 200 seconds, and gradually gets more and more stable near 10 milliamps at around 800 seconds. The change in the beam current is likely a function of several factors, some of which are more measurable than others, such as pressure within the ion source 304 (ig1) and extraction current 306 (extrl), where the extraction current corresponds to the total current coming out of the source across a high voltage power supply biasing the source, or rather the total current load on the power supply that biases the source relative to terminal potential/extraction voltage. Factors that may not be measured as easily may include, for example, the ratio of phosphorous to phosphine, $PH_2$ or other contaminants within source, etc.

Figure 4:
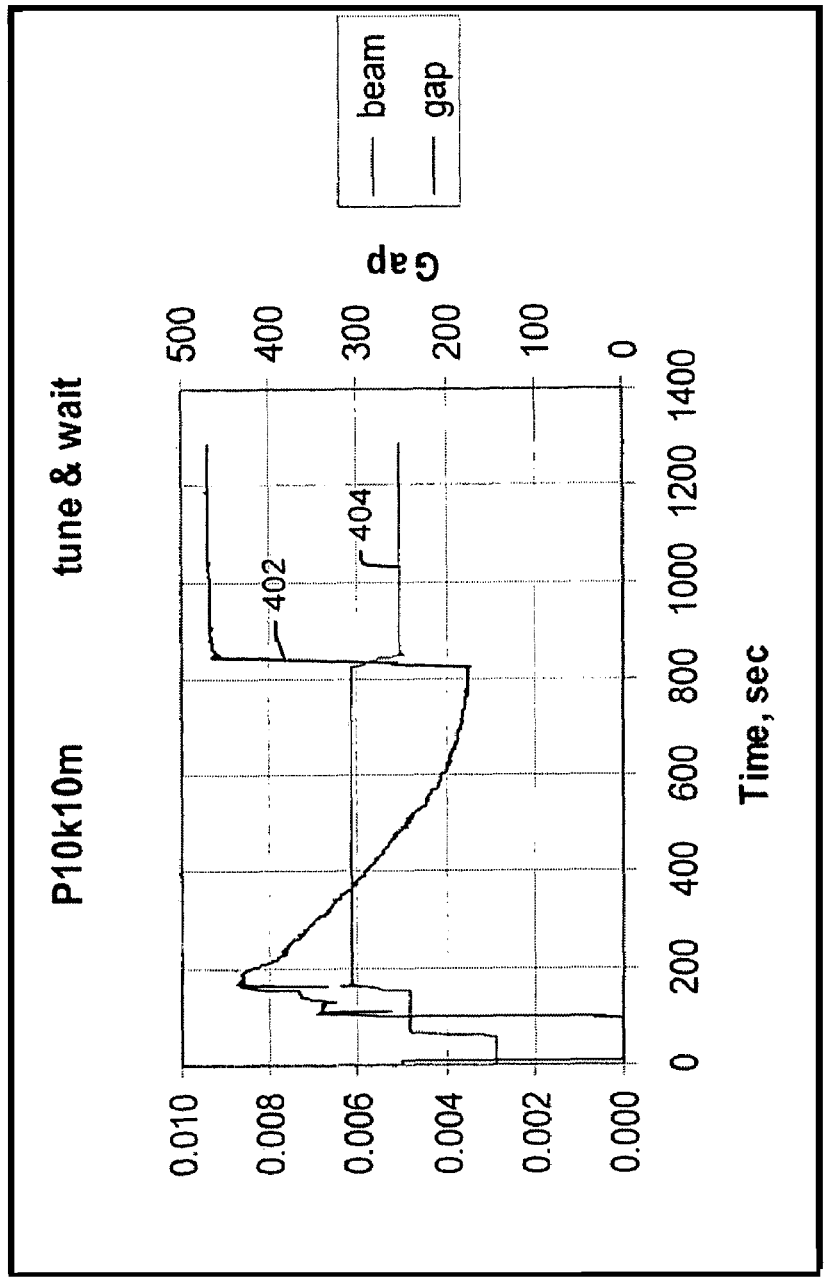
FIG. 4 is a graphical depiction illustrating beam current stabilization as a function of an orientation of electrodes to an ion source.

Turning to FIG. 4, a graphical depiction 400 illustrates changes in beam current 402 as a function of an orientation 404 of extraction electrodes relative to a slit in the ion source. More particularly, the distance between the extraction electrode and the source exit slit is altered to adjust the beam current 402. This change in distance is represented as a "gap" plot 404 in FIG. 4. In the illustrated example, it can be seen that the extraction electrode is moved for about the first 200 seconds to aggressively increase the beam current 402 to around 8 milliamps. However, once the electrode is held still and thus the gap plot 404 has no slope, the beam current then begins to steadily decrease (e.g., down to a little below 4 milliamps after about 800 seconds). The extraction electrode is then moved again to increase the beam current back up to around 9 milliamps, after which the current stabilizes and remains relatively constant. However, adjusting operating parameters to regulate beam current in this manner, can be problematic. For example, implantation uniformity of dose must be maintained (e.g., as the workpiece is moved in directions 154, 164 in FIG. 1). For example, once the gap is adjusted, then optics may have to be (re)adjusted, and then arc current may have to be (re)adjusted and so on. It can thus be appreciated that interrupting the implant to readjust the beam current in this manner (at multiple intervals) can be an inefficient and time consuming technique for achieving desired ion implantations.

Figure 5:
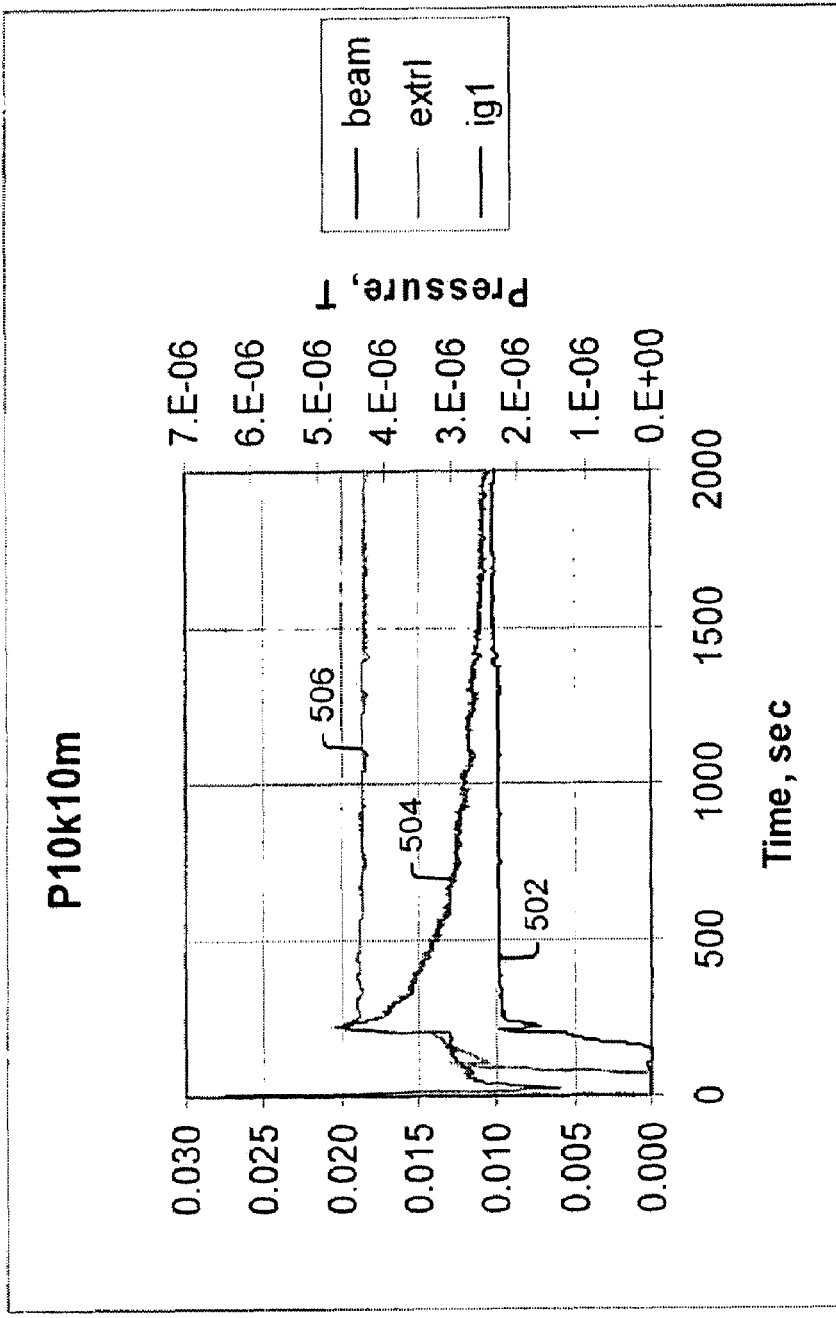
FIG. 5 is a graphical depiction illustrating beam current stabilization as a function of adjustments to source gas flow according to one or more aspects of the present invention.

FIG. 5 is a graphical depiction 500 illustrating the stabilization of beam current 502 as a result of merely adjusting the flow of a source gas according to one or more aspects of the present invention. More particularly, rather than just waiting for the beam current to naturally stabilize as depicted in FIG. 3 or (re)adjusting multiple parameters multiple times as depicted in FIG. 4, the flow of a feed gas can merely be adjusted to stabilize the beam current without having to make one or more adjustments to other operating parameters. Like the situation presented in FIG. 3, the implantation system is initiated in FIG. 5 with historical operating parameter values that were previously used to develop a desired beam current. As before, the beam current 502, pressure within the ion source 504 and extraction current 506 are initially somewhat erratic. However, at about 200 seconds the beam current is forced to the desired level of about 10 milliamps by adjusting (e.g., increasing) the gas flow. The gas flow rate is then selectively readjusted (e.g., via a feedback loop) to maintain the beam current at the desired level (of about 10 milliamps). It is to be appreciated that adjusting the source gas flow rate to stabilize beam current as described herein is a preferable stabilization technique because fluctuations in the beam current may be primarily attributable to issues related to the source gas, such as phosphine disassociation, for example. In this manner, the technique described herein addresses or curtails the source of the problem, rather than merely attempting to manage the adverse effects thereof, such as may be the case where operating parameters other than the source gas flow rate (e.g., arc power and/or electrode gap) are selectively adjusted.

Note that the extraction current 506 is proportional to the beam current 502 in FIG. 5. Accordingly, it is to be appreciated that the extraction current can 506 also be regulated or stabilized by merely adjusting the gas flow rate. It may be desirable to regulate the extraction current since other factors may skew measurements of the beam current at the end of the beamline. For example, the Faraday cup is generally located behind the workpiece and thus measures the beam current after the workpiece passes by the beam or when the beam passes through a hole or other type of aperture in the workpiece. However, interaction of the beam with the workpiece can somewhat "artificially" push current readings up or down. For example, when the beam impinges upon resist material on the workpiece, some of the resist material may be vaporized and may produce gasses that can neutralize some of the beam and alter the pressure in the end station, which may, in turn artificially decrease beam current readings, for example. Maintaining the extraction current at a desired level allows the beam current at the end station to be stabilized without regard to external factors and their associated "artificial" effects given that the beam current is generally proportional to the extraction current.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" as utilized herein merely means an example, rather than the best.

What is claimed is:

1. A method of implanting ions into a workpiece, comprising:
    initiating an ion implantation process; and
    solely adjusting a source gas feed to achieve a desired stabilized beam current.

2. The method of claim 1, comprising:
    implementing a control feedback loop to make continual non-discrete adjustments to the source gas feed in real time based upon corresponding measurements taken of the beam current to achieve the desired stabilized beam current.

3. The method of claim 2, comprising:
    adjusting the source gas feed to achieve a desired extraction current.

4. The method of claim 1, comprising:
    adjusting the source gas feed to achieve a desired extraction current.

5. The method of claim 4, comprising:
    implementing a control feedback loop to make continual non-discrete adjustments to the source gas feed in real time based upon corresponding measurements taken of the beam current to achieve the desired stabilized beam current.

6. The method of claim 3, comprising:
    moving the wafer relative to the ion beam to implant ions into the workpiece.

7. A method of implanting ions into a workpiece, comprising:
    initiating an ion implantation process; and
    implementing a control feedback loop to make continual non-discrete adjustments to a source gas feed in real time based upon corresponding measurements taken of the beam current to achieve a desired stabilized beam current.

8. The method of claim 7, comprising:
solely adjusting the source gas feed to achieve the desired stabilized beam current.
9. The method of claim 8, comprising:
adjusting the source gas feed to achieve a desired extraction current.
10. The method of claim 7, comprising:
adjusting the source gas feed to achieve a desired extraction current.
11. The method of claim 10, comprising:
solely adjusting the source gas feed to achieve the desired stabilized beam current.
12. The method of claim 9, comprising:
moving the wafer relative to the ion beam to implant ions into the workpiece.
13. The method of claim 11, comprising:
moving the wafer relative to the ion beam to implant ions into the workpiece.
14. A method of implanting ions into a workpiece, comprising:
initiating an ion implantation process; and
adjusting a source gas feed to achieve a desired stabilized extraction current.
15. The method of claim 14, comprising:
solely adjusting the source gas feed to achieve the desired stabilized beam current.
16. The method of claim 15, comprising:
implementing a control feedback loop to make continual non-discrete adjustments to the source gas feed in real time based upon corresponding measurements taken of the beam current to achieve the desired stabilized beam current.
17. The method of claim 14, comprising:
implementing a control feedback loop to make continual non-discrete adjustments to the source gas feed in real time based upon corresponding measurements taken of the beam current to achieve the desired stabilized beam current.
18. The method of claim 17, comprising:
solely adjusting the source gas feed to achieve the desired stabilized beam current.
19. The method of claim 16, comprising:
moving the wafer relative to the ion beam to implant ions into the workpiece.
20. The method of claim 18, comprising:
moving the wafer relative to the ion beam to implant ions into the workpiece.

* * * * *